(12) United States Patent
Yasuda (10) Patent No.: US 7,274,587 B2
(45) Date of Patent: Sep. 25, 2007

(54) SEMICONDUCTOR MEMORY ELEMENT AND SEMICONDUCTOR MEMORY DEVICE

(75) Inventor: Shinichi Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 41 days.

(21) Appl. No.: 11/156,582

(22) Filed: Jun. 21, 2005

(65) Prior Publication Data

US 2006/0098473 A1    May 11, 2006

(30) Foreign Application Priority Data

Nov. 10, 2004    (JP) .............................. 2004-326812

(51) Int. Cl.
*G11C 11/00*    (2006.01)

(52) U.S. Cl. ....................... 365/148; 365/184; 365/226

(58) Field of Classification Search ................ 365/148, 365/184

See application file for complete search history.

(56) References Cited

U.S. PATENT DOCUMENTS 5,301,146 A * 4/1994 Hama .......................... 365/154
5,544,109 A * 8/1996 Uchida et al. .............. 365/203
6,271,568 B1 * 8/2001 Woodruff et al. ........... 365/154

FOREIGN PATENT DOCUMENTS

| JP | 11-266043 | 9/1999 |
|---|---|---|
| JP | 2001-237388 | 8/2001 |
| JP | 2001-273785 | 10/2001 |
| JP | 2003-323791 | 11/2003 |
| KR | 1999-0077881 | 10/1999 |
| WO | WO 2004/084228 A1 | 9/2004 |

* cited by examiner

*Primary Examiner*—Thong Q. Le
(74) *Attorney, Agent, or Firm*—Oblon, Spivak, McClelland, Maier & Neustadt, P.C.

(57) ABSTRACT

A semiconductor memory element that stores data as a resistance difference. The memory element comprises a MIS transistor, a two-terminal variable resistor element, and a fixed resistor element. The MIS transistor has a gate. The two-terminal variable resistor element is connected between the gate of the MIS transistor and a first power-supply terminal. The variable resistor element has a resistance that changes in accordance with a current flowing in the variable resistor element or the direction in which the current flows and that remains unchanged when the current is made to stop flowing. The fixed resistor element is connected between the gate of the MIS transistor and a second power-supply terminal.

20 Claims, 3 Drawing Sheets

SEMICONDUCTOR MEMORY ELEMENT AND SEMICONDUCTOR MEMORY DEVICE

CROSS-REFERENCE TO RELATED APPLICATIONS

This application is based upon and claims the benefit of priority from prior Japanese Patent Application No. 2004-326812, filed Nov. 10, 2004, the entire contents of which are incorporated herein by reference.

BACKGROUND OF THE INVENTION

1. Field of the Invention

The present invention relates to a semiconductor memory element that stores binary data 0 or 1 in the form of resistance. The invention relates also to a semiconductor memory device that has semiconductor memory elements of this type.

2. Description of the Related Art

Memory cells having a two-layered gate composed of a floating gate provided on a semiconductor substrate and a control gate provided on the floating gate are widely used as electrically programmable, nonvolatile semiconductor memory elements. Further, NAND-type semiconductor memory devices, each having memory cells of this type connected in series to acquire a large storage capacity, have been put to practical use. In the memory cell having a two-layered gate, however, the insulating film surrounding the floating gate cannot be as thin as desired because the floating gate must accumulate an electric charge. Consequently, this memory cell cannot be made smaller or driven at a lower voltage.

MRAMs have been proposed, which incorporate nonvolatile memory cells, such as magnetic tunnel-junction (MTJ) cells, which have no floating gates and which have their resistance changed. To read data from any memory cell that stores the data in the form of resistance, it is usually necessary to supply a current to the memory cell to detect the output voltage thereof or to apply a voltage to the memory cell to detect the output current thereof. Inevitably, the circuits peripheral to memory cells tend to become large. In view of this, a MTJ cell may be combined with a transistor in order to detect the change in resistance from the change in conductance of the transistor. (See Jpn. Pat. Appln. KOKAI Publication No. 2001-273758.)

The MTJ cell has but a low resistance-change rate, and the transistor may have a threshold value that differs from the design value. In view of these, the idea of combining the MTJ cell may be combined with a transistor cannot change the conductance of the transistor as much as desired. Hence, a peripheral circuit that can read minute changes in resistance must be used because the source-drain resistance of the transistor changes but a little. The use of the peripheral circuit is not more advantageous than to read the change in resistance of the MTJ cell.

As indicated above, a memory cell having a two-layered gate is disadvantageous in that the insulating film surrounding the floating gate cannot be as thin. Inevitably, the memory cell cannot be made smaller or driven at a lower voltage. By contrast, a semiconductor memory cell that stores the data in the form of resistance needs a large peripheral circuit for detecting the resistance of the memory cell.

BRIEF SUMMARY OF THE INVENTION

According to an aspect of this invention, there is provided a semiconductor memory element comprising:
a first power-supply terminal and a second power-supply terminal;
a MIS (Metal Insulator Semiconductor) transistor including a gate;
a two-terminal variable resistor element connected between the gate of the MIS transistor and the first power-supply terminal, the variable resistor element having a resistance that changes in accordance with a current flowing in the variable resistor element or the direction in which the current flows but remains unchanged due to cutoff of the current; and
a fixed resistor element connected between the gate of the MIS transistor and the second power-supply terminal.

According to another aspect of the invention, there is provided a semiconductor memory element comprising:
a first power-supply terminal and a second power-supply terminal;
a MIS transistor including a gate;
a first two-terminal variable resistor element connected between the gate of the MIS transistor and the first power-supply terminal, the first variable resistor element having a resistance that changes in accordance with a current flowing in the first variable resistor element or the direction in which the current flows but remains unchanged due to cutoff of the current;
a second two-terminal variable resistor element connected between the gate of the MIS transistor and the second power-supply terminal, the second variable resistor element having a resistance that changes in accordance with a current flowing in the second variable resistor element or the direction in which the current flows but remains unchanged due to cutoff of the current; and
a control node connected to the gate of the MIS transistor.

DETAILED DESCRIPTION OF THE INVENTION

Embodiments of this invention will be described in detail, with reference to the accompanying drawings.

FIRST EMBODIMENT

Figure 1:
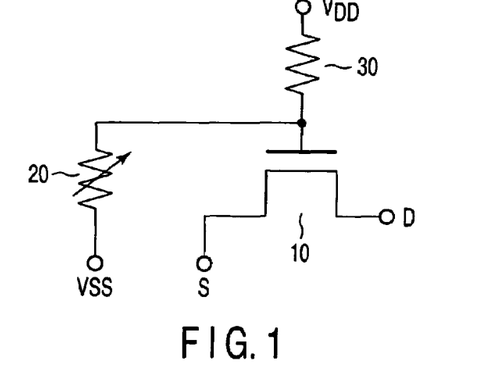
FIG. 1 is a circuit diagram showing a semiconductor memory element according to a first embodiment of the present invention.

FIG. 1 is a circuit diagram showing a semiconductor memory element according to the first embodiment of the invention. The memory element shown here is one of the components (i.e., memory cells) that constitute a memory array.

As FIG. 1 shows, the memory element comprises a metal oxide semiconductor (MOS) transistor 10, a variable resistor element 20, and a resistor 30 (fixed resistor element). The variable resistor element 20 is connected at one end to the gate of the MOS transistor 10 and at the other end to the first power-supply terminal (e.g., ground terminal $V_{SS}$ terminal). The resistor 30 is connected at one end to the gate of the MOS transistor 10 and at the other end to the second power-supply terminal (e.g., power-supply terminal $V_{DD}$). The variable resistor element 20 is made of, for example, phase-changing material. Its resistance varies with the temperature to which it is heated. More precisely, the variable resistor element 20 has either first resistance or second resistance higher than the first resistance, in accordance with the temperature determined by the amount of current supplied to it.

For the equation below, assume that $V_{DD} > V_{SS}$. The voltage applied to the gate of the transistor 10 is given as follows:

$$(V_{DD} - V_{SS}) \cdot R2/(R1+R2) \quad (1)$$

where R1 is the resistance of the resistor 30, and R2 is the resistance of the variable resistor element 20.

Figure 2:
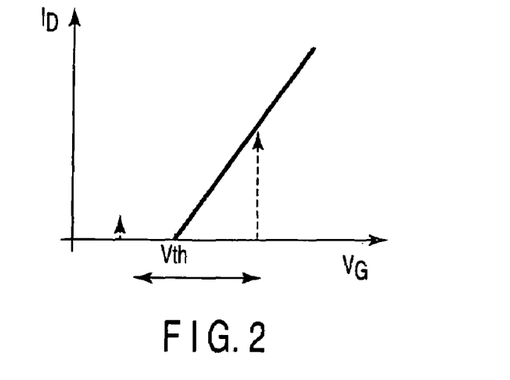
FIG. 2 is a graph representing the relation between the threshold voltage of the MOS transistor used in the memory element of FIG. 1 and two gate voltages that may be applied to the MOS transistor.

The resistance R2 of the variable resistor element 20 can vary. If the resistance R2 varies, the gate voltage that is to be applied to the transistor 10 will be changed. If the gate voltage is set within such a range as shown in FIG. 2, which includes the threshold voltage $V_{th}$ of the transistor 10, the transistor 10 can be turned on or off in accordance with the resistance R2 of the variable resistor element 20.

The variable resistor element 20 and the resistor 30 can be formed in a silicon substrate, an interconnection layer or an insulating film. They can be connected by a wire. For example, the variable resistor element 20 and the resistor 30 may be buried in via holes that extend between the gate electrode and the interconnection layer and may be connected by a wire. In this case, the overhead in terms of area can be reduced almost to zero.

Figure 3A:
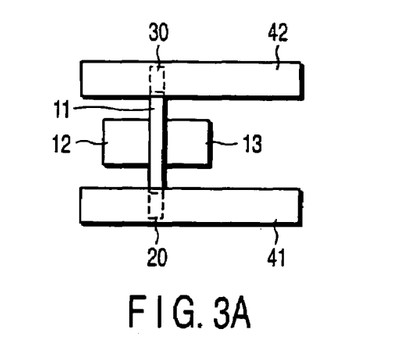
FIG. 3A is a plain view of a memory element that has a fixed resistor element and a variable resistor element, both provided in via holes extending from a gate electrode and an interconnection layer.
Figure 3B:
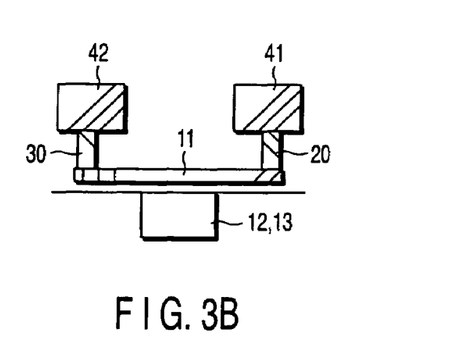
FIG. 3B is a sectional view of the memory element shown in FIG. 3A.

FIGS. 3A and 3B show a memory element comprising a transistor 10, a variable resistor element 20, and a resistor 30. The resistor element 20 and the resistor 30 are buried in via holes. FIG. 3A is a plan view, and FIG. 3B is a sectional view. As shown in FIGS. 3A and 3B, the transistor 10 has a gate 11, a source 12 and a drain 13, and the memory element has a low-potential wire 41 and a high-potential wire 42.

In FIG. 3B, the low-potential wire 41 and a high-potential wire 42 are illustrated as layers that are located at the same level and extend parallel to each other. Nonetheless, the wires 41 and 42 need not be at the same level or need not extend parallel. Their position and their orientation can be determined in accordance with the direction in which the source-drain path of the transistor 10 extends and with the positions of the other components of the memory cell.

The variable resistor element 20 and the resistor 30 are designed to have such resistances that the voltage applied to the gate of the transistor 10 falls within a range that includes the threshold value of the transistor 10. The resistance of the variable resistor element 20 and the resistance of the resistor 30 may be determined before the threshold value of the transistor 10. In this case, the range for the gate voltage of the transistor 10 is determined first. Then, the transistor 10 is designed to have a threshold value that falls within this range of gate voltage.

In the memory cell of FIG. 1, the variable resistor element 20 must meet the following requirements to compensate for the characteristics of the transistor 10 that differ from the design characteristics:

$$\{R2_{min}/(R1+R2_{min})\}V < V_{th} - \sigma_a V_{th}$$

$$\{R2_{max}/(R1+R2_{max})\}V > V_{th} - \sigma_b V_{th} \quad (2)$$

where R1 is the resistance of the resistor 30, $R2_{min}$ is the lowest resistance the variable resistor element 20 may have, $R2_{max}$ is the highest resistance the variable resistor element 20 may have, V is the difference $(V_{DD} - V_{SS})$ between the high voltage $V_{DD}$ and the low voltage $V_{SS}$ that may be applied to read data from the memory cell, and $V_{th}$ is the threshold value of the transistor 10. Note that $\sigma_a V_{th}$ and $\sigma_b V_{th}$ are voltage margins required in consideration of noise, the specification of the data-reading circuit. More specifically, $\sigma_a V_{th}$ is the voltage margin at the negative side, and $\sigma_b V_{th}$ is the voltage margin at the positive side.

All terms in these inequalities (2) have positive value. Hence:

$$[\{V - (1-\sigma_a)V_{th}\}/(1-\sigma_a)V_{th}] \cdot R2_{min} < R1 < [\{V-(1+\sigma_b) V_{th}\}/(1+\sigma_b)V_{th}] \cdot R2_{max} \quad (3)$$

Thus, the transistor 10, the variable resistor element 20 and the resistor 30 are designed to such characteristics as to satisfy the inequality (3).

The rate α at which the resistance of the variable resistor element 20 changes may be defined as:

$$\alpha = R2_{max}/R2_{min} \quad (4)$$

From the inequality (3), the rate α is given as follows:

$$\alpha > [\{V - (1-\sigma_a)V_{th}\}/(1-\sigma_a)V_{th}] \cdot [(1+\sigma_b)V_{th}/\{V-(1+\sigma_b) V_{th}\}] \quad (5)$$

The variable resistor element 20 should have its resistance changed at the rate α defined by the inequality (5).

Figure 4:
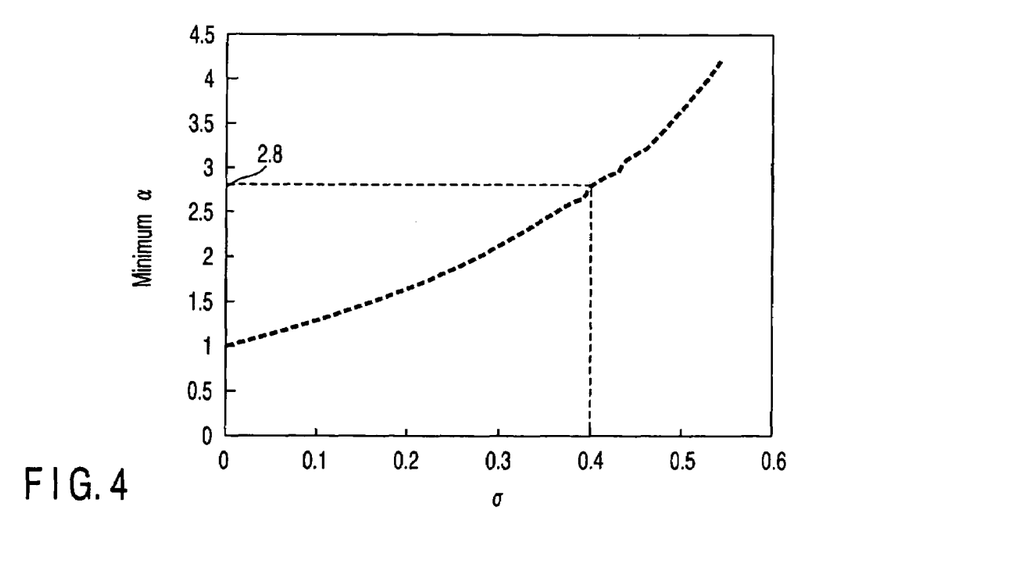
FIG. 4 is a graph illustrating the relation between the voltage margin for the variable resistor element shown in FIG. 3A and the rate at which the resistance of the variable resistor element changes.

The rate α depends on the gate voltage, threshold voltage, $\sigma_a$ and $\sigma_b$. ITRS (International Technology Roadmap for Semiconductors), 2003 edition, for example, teaches how the rate α depends on σ when the voltage for the hp65 generation is 1.1V and the threshold value is 0.18V so that $\sigma_a = \sigma_b = \sigma$. In FIG. 4, σ is plotted on the X-axis and the minimum α is plotted on the Y-axis. As seen from FIG. 4, the rate α of resistance change should be about 2.8 at the least, in order to secure a voltage margin of about, for example, $\pm 0.4\ V_{th}$.

Since the variable resistor element 20 is buried in a via hole, it is preferably an element that has two terminals. In view of this, the variable resistor element 20 may be made of phase-changing material such as $Ge_2Sb_2Te_5$ or any other calcogenide-based substance, ionic conductive material such as $Cu_2S$, rotaxane supermolecules, or other molecular material. Alternatively, the element 20 may be an element that comprises an insulating film and a metal layer provided in the insulating film. Further, the variable resistor element 20 may be made of CMR (Colossal Magneto Resistive) materials, e.g., $Pr_{0.7}Ca_{0.3}MnO_3$, which undergoes resistance changes.

In the memory cell of FIG. 1, the resistor 30 is connected to the $V_{DD}$ terminal and the variable resistor element 20 is connected to the $V_{SS}$ terminal. Needless to say, the resistor 30 and the variable resistor element 20 can be connected to the $V_{SS}$ terminal and the $V_{DD}$ terminal, respectively.

$Ge_2Sb_2Te_5$, for example, was used as phase-changing material for the variable resistor element 20, (see S. H. Lee, et al., Digest of Technical Papers, Symp. on VLSI Tech. 2004, p. 20), and a pulse of 1-mA current was supplied between the first and second power-supply terminals. As a result, the variable resistor element 20 acquired a high resistance of 1 MΩ. (This is because $Ge_2Sb_2Te_5$ became amorphous). Thus, the transistor 10 could remain in ON state. When a pulse of 0.5-mA current was supplied between the first and second power-supply terminals, the variable resistor element 20 acquired a low resistance of 20 kΩ (because it was crystallized). In this case, the transistor 10 could remain in off. Namely:

Low resistance→high resistance (RESET); current: 1 mA
High resistance→low resistance (SET); current: 0.5 mA
Low resistance: 20 kΩ
High resistance: 1 MΩ

If a pulse of 0.5-mA current is supplied, the phase-changing material is heated to a temperature fit for reducing the resistance, and the variable resistor element 20 therefore acquires low resistance. If a pulse of 1-mA current is supplied, the phase-changing material is heated to a temperature higher than the temperature fit for reducing the resistance. Then, the element 20 acquires high resistance when the material is fast cooled from that high temperature.

$Cu_2S$-based material, which is used in solid-state electrolytic memories, was employed as ionic conductive material for the variable resistor element 20 (see T. Sakamoto, et al., Digest of Technical Papers, ISSCC 2004, p. 290). Then, the variable resistor element 20 acquired low resistance of 100 or less when 0V was applied to the metal layer of the metal-$Cu_2S$—Cu structure and 0.55V was applied to the Cu layer of the metal-$Cu_2S$—Cu structure. The transistor 10 was thereby maintained in OFF state. When voltages of 0.3V and 0V were applied to the metal layer and Cu layer, respectively, the element 20 exhibited resistance of 100 MΩ or more. This maintained the transistor 10 in ON state. Thus, if the variable resistor element 20 is made of ionic conductive material, its resistance can be varied by changing the current-applying direction. Namely:

Write: Metal, 0V; Cu, 0.55V, 10 ms→resistance<100 Ω
Erase: Metal, 0.3V; Cu, 0V, 10 ms→resistance>100 MΩ

Alternatively, the variable resistor element 20 was made of $Pr_{0.7}Ca_{0.3}MnO_3$, i.e., one of CMR materials (as described in W. Zhuang, et al., Digest of Technical Papers, IEDM 2002, p. 193). When voltage of 5V was applied between the first and second power-supply terminals for 20 ns, this variable resistor element 20 exhibited low resistance of about 1 kΩ. The transistor 10 was thereby maintained in OFF state. When voltage of −5V was applied between the first and second power-supply terminals for 10 ns, the element 20 exhibited high resistance of about 1 MΩ. The transistor 10 was thereby maintained in an ON state. That is:

Write: +5V, 20 ns
Erase: −5V, 10 ns
High resistance: ~1 kΩ
High resistance: ~1 MΩ (max)

As indicated above, the connection node of the variable resistor element 20 and resistor 30 is connected to the gate of the MOS transistor 10 in the present embodiment. Hence, the gate voltage of the MOS transistor 10 can be controlled in accordance with the resistance of the variable resistor element 20. In other words, the MOS transistor 10 can be turned on and off by varying the resistance of the variable resistor element 20. The memory cell of FIG. 1 can therefore perform its function.

Unlike a NAND-type flash memory cell, the memory cell of FIG. 1 can operate at a low voltage. In addition, the resistance of the variable resistor element 20 can change at high rate because the element 20 is a two-terminal element made of phase-changing material. Therefore, the conductance of the transistor 10 can greatly change. As the conductance of the transistor 10 so changes, the change in the resistance of the element 20 can be reliably detected. Thus, the memory cell shown in FIG. 1 requires no large peripheral circuits for detecting the resistance of the element 20. This makes it possible to provide a memory device of high integration density.

SECOND EMBODIMENT

Figure 5:
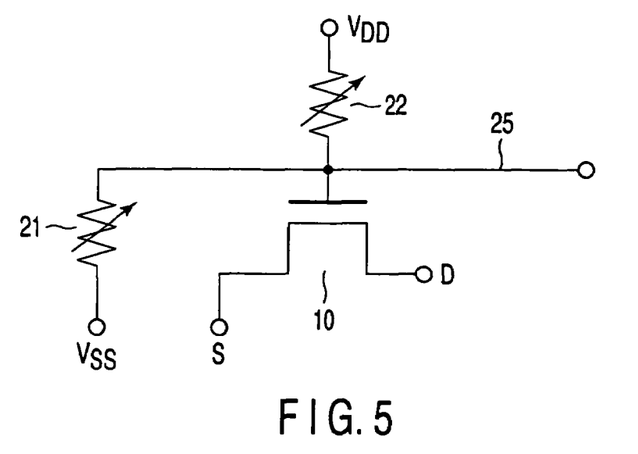
FIG. 5 is a circuit diagram depicting a semiconductor memory element according to a second embodiment of the invention.

FIG. 5 is a circuit diagram that illustrates a semiconductor memory element according to the second embodiment of the present invention. More precisely, FIG. 5 depicts the structure of the smallest units (i.e., memory cells) that constitute a memory array.

The second embodiment differs from the first embodiment in that a control node 25 is provided as an additional component. As FIG. 5 shows, a first variable resistor element 21 is connected between the gate of a MOS transistor 10 and the first power-supply terminal (e.g., ground terminal $V_{SS}$). And a second variable resistor element 22 is connected between the gate of the MOS transistor 10 and the second power-supply terminal (e.g., power-supply terminal $V_{DD}$). The control node 25 is led from the gate of the MOS transistor 10.

In the first embodiment, the variable resistor element 20 and the resistor 30 are connected in series. In the second embodiment, the element 22 functions as a variable resistor element because the control node 25 is provided. That is, the two variable resistor elements 21 and 22 can have high resistance and low resistance, respectively, vice versa, by controlling the potential at the control node 25 and the voltages $V_{DD}$ and $V_{SS}$. As a result, the voltage applied to the gate of the transistor 10 can vary over a broader range than in the first embodiment (FIG. 1) that has only one variable resistor element. In other words, the resistance of each variable resistor element can vary over a narrower range.

The second embodiment operates in the same way as the first embodiment does. To change the resistance of the variable resistor element 21, a voltage is applied between the control node 25 and the first power-supply terminal. To change the resistance of the variable resistor element 22, a voltage is applied between the control node 25 and the second power-supply terminal.

For example, the control node 25 is set at the ground potential, a high voltage for increasing the resistance of phase-changing material is applied to the first power-supply terminal, and a low voltage for decreasing the resistance of phase-changing material is applied to the second power-supply terminal. It is therefore possible to increase the resistance of the variable resistor element 21 and to decrease the resistance of the variable resistor element 22. The transistor 10 can thereby be turned on. Conversely, a low voltage may be applied to the first power-supply terminal, and a high voltage may be applied to the second power-supply terminal. In this case, the resistance of the variable resistor element 21 can be lowered and the resistance of the variable resistor element 22 can be raised, and the transistor 10 can thereby be turned on.

The second embodiment can therefore achieve the same advantages as the first embodiment. Moreover, the voltage applied to the gate of the transistor 10 can be more changed since both resistor elements 21 and 22 used are variable resistor elements. Thus, the variable resistor elements 21 and 22 and the transistor 10 can be designed at a high degree of freedom.

THIRD EMBODIMENT

Figure 6:
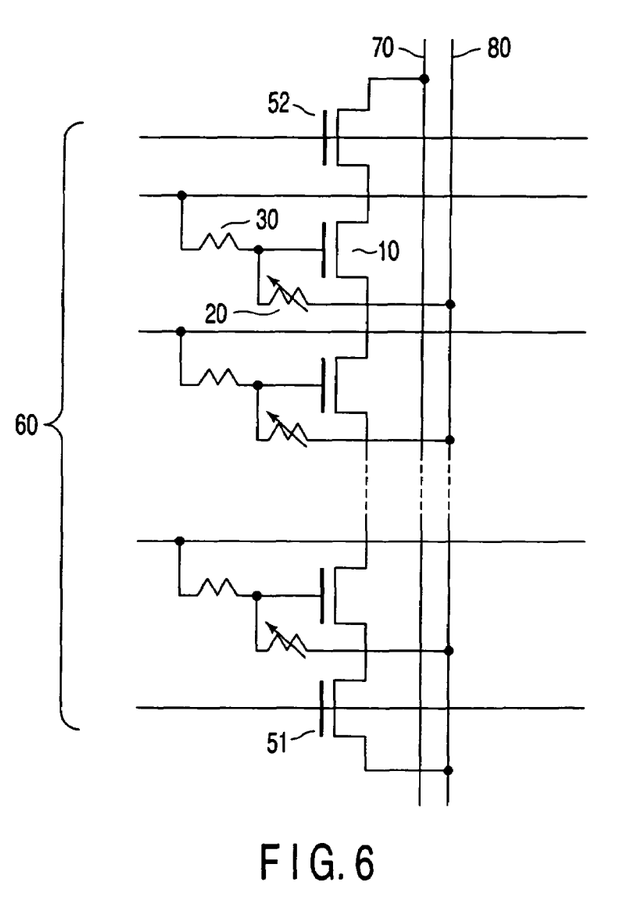
FIG. 6 is a circuit diagram showing a semiconductor memory device according to a third embodiment of this invention.

FIG. 6 is a circuit diagram showing a semiconductor memory device that is the third embodiment of the present invention.

More specifically, FIG. 6 depicts one of the blocks constituting a memory cell array, which includes memory cells of the type shown in FIG. 1. Memory cells of the type shown in FIG. 1 are connected in series, providing a series circuit. Two selection transistors are connected to the ends of this series circuit. The block shown in FIG. 6 and other identical blocks are arranged in rows and columns and are connected to one another, constituting the memory cell array.

As shown in FIG. 6, transistors 10 identical to the transistor included in the memory cell of FIG. 1 are connected in series, constituting a memory cell unit. The first selection transistor 51 is connected between the ground node of the memory cell unit and a source line 80. The second selection transistor 52 is connected between the power-supply node of the memory cell unit and a bit line 70. In each memory cell, the resistor 30 is connected to a word line 60 at one end (i.e., second power-supply terminal) that faces away from the gate of the transistor 10, and to the source line 80 at the other end (i.e., first power-supply terminal).

How the semiconductor memory device operates will be explained below.

Figure 7:
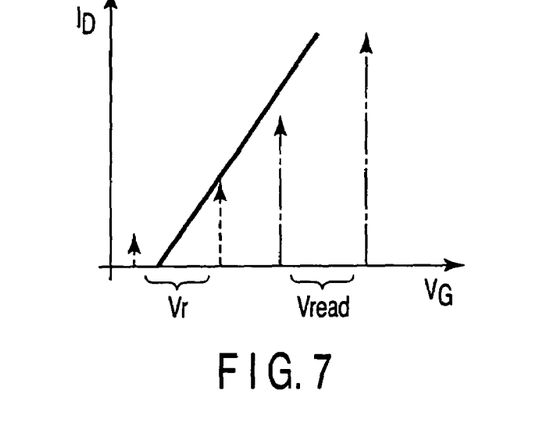
FIG. 7 is a graph explaining how data is read from the memory device shown in FIG. 6.

How data is read from a memory cell of semiconductor memory device will be described first. A relatively low voltage Vr shown in FIG. 7 is applied to the word line 60 to which the target memory cell is connected. On the other hand, a relatively high voltage Vread is applied the other word lines 60 and the selection transistors 51 and 52. Voltage Vr has such a value that the gate voltage of the transistor 10 of the target memory cell falls within a range that includes the threshold value. Voltage Vread has such a value that the gate voltage of the transistor 10 of the target memory cell exceeds the threshold value.

The bit line is pre-charged, applying a voltage of the value described above is applied to the word line 60 to which the target memory cell is connected. If the transistor 10 of the memory cell selected is off, the potential of the bit line 70 is maintained. If the transistor 10 is on, the bit line 70 is connected to the source line 80. Thus, the bit line 70 is set to the potential (usually, GND potential) of the source line 80. The difference between these potentials that the bit line 70 may have is detected by the sense amplifier that is connected to the bit line 70.

To read data from any memory cell selected, the transistor 10 of the memory cell need not be completely turned on or off. It is sufficient for the transistor 10 to have a gate voltage that is between an OFF range and a sub-threshold region. Thus, the variable resistor element 20 of each memory cell can be so designed that its resistance varies over such a range. As FIG. 6 shows, the variable resistance element 20 is connected to the source line 80. Instead, the element 20 may be connected to the word line 60. If this is the case, the resistor 30 is connected to the source line 80.

It will be described how data is written into, or erased in, a memory cell of semiconductor memory device. The method of writing and erasing data depends on the type of the variable resistor element 20. The element 20 may be one into which data is written in the form of a pulse voltage. Then, the word lines 60, to which the target cell is not connected, are opened, the source line 80 is connected to the ground, and a pulse signal is supplied to the word line 60 to which the target cell is connected, to write or erase data. Alternatively, the element 20 may be one into which data is written in the form of the polarity of a voltage. In this case, the word lines 60, to which the target cell is not connected, are opened, and the voltages applied to the source line 80 and the word line 60, to which the target cell is connected, are adjusted in terms of polarity, in order to write or erase data.

No matter whether the variable resistor element of each memory cell is one that serves to write or erase data in the form of a current pulse or voltage polarity, data can be erased in all memory cells by supplying the same signal to the word lines 60.

The semiconductor memory device can be a NAND-type semiconductor memory device that comprises memory cells of the type according to the first embodiment. The third embodiment can provide a NAND-type semiconductor memory device that has a high integration density and can be operated at a low voltage.

In the third embodiment, each memory cell includes a transistor of ordinary type. The third embodiment can therefore operate at a low voltage, unlike flash memories. A current keeps flowing in the variable resistor element 20 of each memory cell until the sense amplifier latches the potential of the bit line 70. Nevertheless, the memory device consumes but a little power, because it operates at a low voltage. The power consumption can be reduced by increasing the resistance of the resistor 30 and that of the variable resistor element 20 in absolute value. This is because the range of the gate voltage of each cell is determined by the ratio of the resistance of the resistor 30 to that of the variable resistor element 20. After the sense amplifier has latched the potential of the bit line 70, a voltage need not be applied to the word lines 60.

Memories have been proposed, which comprise variable resistor elements made of phase-changing material. Hitherto, however, selection transistors are connected in series to variable resistor elements, respectively. A voltage is applied or a current is supplied to any variable resistor element selected, thereby to detect the voltage or the current and thus reading data. Since the resistor elements are have two terminals each, the memory cells can hardly be connected in series to enhance the integration density. They are inevitably connected in parallel. In the third embodiment of this invention, the memory cells can be connected in series. The third embodiment can therefore acquire a high integration density.

It is of course possible to connect the memory cells in parallel in the third embodiment. Even in this case, the memory device can operate at a low voltage, thus consuming small power while operating.

FOURTH EMBODIMENT

Figure 8:
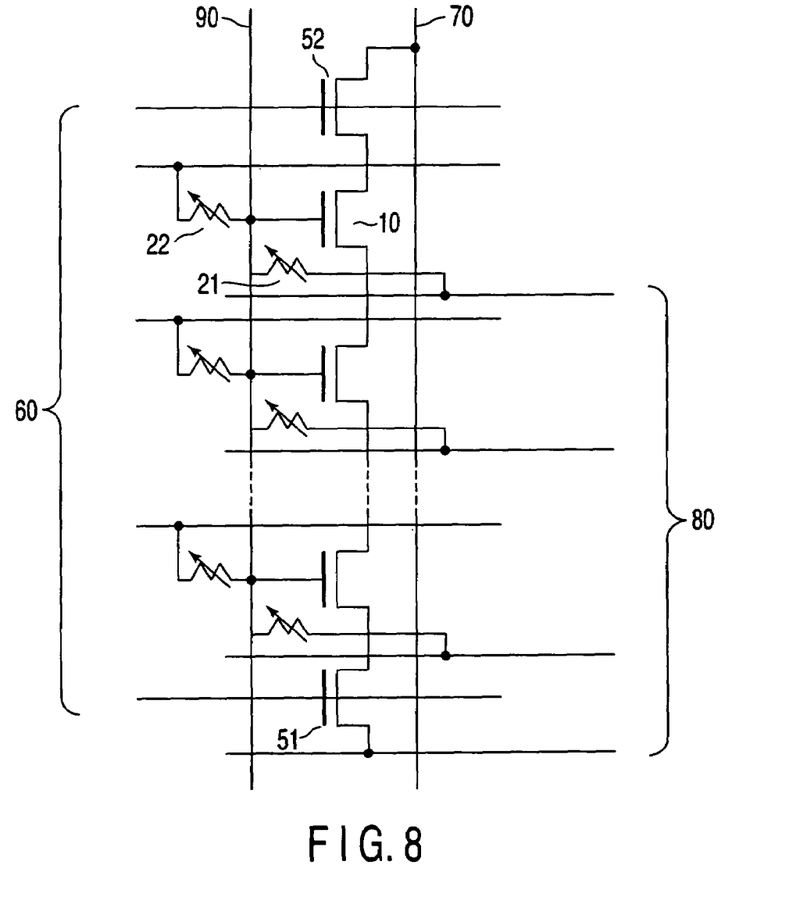
FIG. 8 is a circuit diagram showing a semiconductor memory device according to a fourth embodiment of the present invention.

FIG. 8 is a circuit diagram showing a semiconductor memory device according to the fourth embodiment of this invention.

More correctly, FIG. 8 illustrates one of the blocks constituting a memory cell array, which includes memory cells of the type shown in FIG. 5. Except for the type of memory cells, the fourth embodiment is essentially identical to the third embodiment (FIG. 6).

As shown in FIG. 8, the transistors 10 of memory cells are connected in series, constituting a memory cell unit. The first selection transistor 51 is connected between the ground node of the memory cell unit and a source line 80. The second selection transistor 52 is connected between the power-supply node of the memory cell unit and a bit line 70. In each memory cell, the variable resistor element 20 is connected to a word line 60 at one end (i.e., second power-supply terminal) that faces away from the gate of the transistor 10, and to a source line 80 at the other end (i.e., first power-supply terminal).

In the fourth embodiment, each memory cell has a control node as shown in FIG. 5. Therefore, the direction in which the word lines 60, source lines 80 and control line 90 (connecting control nodes) extend should be taken into consideration. The control line 90 opens to read data from the memory cells. To write or erase data into or in the memory cells, the control line 90 is set to the GND potential and a pulse voltage is applied to the word line 60 and source line 80 of any cell selected, so that the resistances of the variable resistor elements 21 and 22 may have a high resistance and a low resistance, or vice versa. In the case where the data is written or erased in accordance with the polarity of voltage, the word line 60 and source line 80 are set to a high potential and the control line 90 is set to a low potential, or the other way around.

The fourth embodiment attains the same advantage as the third embodiment. In addition, the design margin for the variable resistor elements 21 and 22 is broad in the fourth embodiment, though the load capacitance and the element area increases a little because the control line 90 is used.

MODIFIED EMBODIMENTS

The present invention is not limited to the embodiments described above. The variable resistor elements may be made of material other than phase-changing material, ionic conductive material and CMR. They can be made of molecular material (see Y. Chen et al., Appl. Phys. Lett. Vol. 82, p. 1610 (2003)). Furthermore, the element 20 may comprise an insulating film and a metal layer provided in the insulating film (see L. Ma et al., Appl. Phys. Lett., Vol. 80, p. 2997 (2002)). In the embodiments described above, the switching transistors are MOS transistors that have a gate insulating film made of oxide. Needless to say, the MOS transistors can be replaced by MIS (Metal Insulator Semiconductor) transistors that have a gate insulating film made of material other than oxide.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory element, comprising:
a first power-supply terminal and a second power-supply terminal;
a MIS (Metal Insulator Semiconductor) transistor including a gate;
a two-terminal variable resistor element connected between the gate of the MIS transistor and the first power-supply terminal, the variable resistor element having a resistance that changes in accordance with a current flowing in the variable resistor element or a direction in which the current flows but remains unchanged due to cutoff of the current; and
a fixed resistor element connected between the gate of the MIS transistor and the second power-supply terminal,
wherein the variable resistor element has a first resistance or a second resistance higher than the first resistance, in accordance with the current flowing in the variable resistor element or the direction in which the current flows, and
the gate of the MIS transistor is set to a voltage lower than a threshold value $V_{th}$ of the transistor when the variable resistor element has the first resistance, and to a voltage higher than the threshold value $V_{th}$ when the variable resistor element has the second resistance.

2. The semiconductor memory element according to claim 1, wherein:

$$\{R2_{min}/(R1+R2_{min})\}V < V_{th} - \sigma_a V_{th}$$

$$\{R2_{max}/(R1+R2_{max})\}V > V_{th} + \sigma_b V_{th}$$

where R1 is the resistance of the fixed resistor element, $R1_{min}$ is the first resistance of the variable resistor element, $R2_{max}$ is the second resistance of the variable resistor element, V is a difference between a voltage applied to the first power-supply terminal and a voltage applied to the second power-supply terminal, respectively, to read data, $\sigma_a V_{th}$ is a negative voltage margin for a threshold value $V_{th}$, and $\sigma_b V_{th}$ is a positive voltage margin for a threshold value $V_{th}$.

3. A semiconductor memory element, comprising:
a first power-supply terminal and a second power-supply terminal;
a MIS (Metal Insulator Semiconductor) transistor including a gate;
a two-terminal variable resistor element connected between the gate of the MIS transistor and the first power-supply terminal, the variable resistor element having a resistance that changes in accordance with a current flowing in the variable resistor element or a direction in which the current flows but remains unchanged due to cutoff of the current; and
a fixed resistor element connected between the gate of the MIS transistor and the second power-supply terminal,
wherein the variable resistor element is made of phase-changing material, ionic conductive material or CMR.

4. A semiconductor memory element, comprising:
a first power-supply terminal and a second power-supply terminal;
a MIS (Metal Insulator Semiconductor) transistor including a gate;
a two-terminal variable resistor element connected between the gate of the MIS transistor and the first power-supply terminal, the variable resistor element having a resistance that changes in accordance with a current flowing in the variable resistor element or a direction in which the current flows but remains unchanged due to cutoff of the current; and a fixed resistor element connected between the gate of the MIS transistor and the second power-supply terminal, wherein the variable resistor element is made of phase-changing material, coming to a low resistance phase by flowing a first current for making a temperature suitable for the phase-changing material to decrease the resistance of the resistor element, and coming to a high-voltage phase by flowing a second current larger than the first current to increase the resistance of the variable resistor element.

5. The semiconductor memory element according to claim 4, wherein, in data writing data, the first power-supply terminal and the second power-supply terminal are adapted to be supplied therebetween with the first current or the second current in accordance with data to be written, in data erasing, the first power-supply terminal, and the second power-supply terminal are adapted to be supplied therebetween with the first current or the second current, and in data reading, the first power-supply terminal and the second power-supply terminal are adapted to be set at a ground potential $V_{SS}$ and a power-supply potential $V_{DD}$, respectively.

6. The semiconductor memory element according to claim 5, wherein, in the data writing or the data erasing, the first power-supply terminal is set at the ground potential $V_{ss}$ and the second power-supply terminal is adapted to be applied with a pulse voltage.

7. A semiconductor memory element, comprising:

a first power-supply terminal and a second power-supply terminal;

a MIS (Metal Insulator Semiconductor) transistor including a gate;

a two-terminal variable resistor element connected between the gate of the MIS transistor and the first power-supply terminal, the variable resistor element having a resistance that changes in accordance with a current flowing in the variable resistor element or a direction in which the current flows but remains unchanged due to cutoff of the current; and a fixed resistor element connected between the gate of the MIS transistor and the second power-supply terminal, wherein the variable resistor element is made of ionic conductive material, coming to a low resistance phase by flowing a current in a first direction to decrease the resistance of the variable resistor element, and coming to a high-resistance phase by flowing a current in a second direction opposite to the first direction to increase the resistance of the variable resistor element.

8. A semiconductor memory element, comprising:

a first power-supply terminal and a second power-supply terminal;

a MIS (Metal Insulator Semiconductor) transistor including a gate;

a two-terminal variable resistor element connected between the gate of the MIS transistor and the first power-supply terminal, the variable resistor element having a resistance that changes in accordance with a current flowing in the variable resistor element or a direction in which the current flows but remains unchanged due to cutoff of the current; and a fixed resistor element connected between the gate of the MIS transistor and the second power-supply terminal, which includes an interlayer insulating film having via holes and provided on the MIS transistor, and wherein the fixed resistor element and variable resistor element are buried in the via holes.

9. A semiconductor memory element comprising:

a first power-supply terminal and a second power-supply terminal;

a MIS transistor including a gate;

a first two-terminal variable resistor element connected between the gate of the MIS transistor and the first power-supply terminal, the first variable resistor element having a resistance that changes in accordance with a current flowing in the first variable resistor element or a direction in which the current flows but remains unchanged due to cutoff of the current;

a second two-terminal variable resistor element connected between the gate of the MIS transistor and the second power-supply terminal, the second variable resistor element having a resistance that changes in accordance with a current flowing in the second variable resistor element or the direction in which the current flows but remains unchanged due to cutoff of the current; and a control node connected to the gate of the MIS transistor.

10. The semiconductor memory element according to claim 9, wherein the first two-terminal variable resistor and the second two-terminal variable resistor element are held by two different resistance values respectively, in accordance with the current flowing in the variable resistor element or the direction in which the current flows, the second two-terminal variable resistor element has a first resistance when the first variable resistor element has a second resistance higher than the first resistance and vice versa.

11. The semiconductor memory element according to claim 10, wherein the MIS transistor has a gate potential lower than a threshold value $V_{th}$ of the MIS transistor when the first variable resistor element and the second variable resistor element have the first resistance and the second resistance, respectively, and the MIS transistor has a gate potential higher than a threshold value $V_{th}$ of the MIS transistor when the first variable resistor and the second variable resistor element have the second resistance and the first resistance, respectively.

12. The semiconductor memory element according to claim 9, wherein the first two-terminal variable resistor element and the two-terminal second variable resistor element are made of phase-changing material, ionic conductive material or CMR.

13. The semiconductor memory element according to claim 9, wherein the control node is released in data reading, and a current is supplied between the control node and the first power-supply terminal and the second power-supply terminal in data writing or data erasing.

14. The semiconductor memory element according to claim 9, wherein the first two-terminal variable resistor element and the second two-terminal variable resistor element each are made of phase-changing material, coming to a low resistance phase by flowing a first current for making a temperature suitable for the phase-changing material to decrease the resistance of the resistor element, and coming to a high-voltage phase by flowing a second current larger than the first current to increase the resistance of the variable resistor element.

15. The semiconductor memory element according to claim 14, wherein,
   in data writing, the first power-supply terminal and the second power-supply terminal are adapted to be supplied therebetween with the first current or the second current in accordance with data to be written,
   in data erasing, the first power-supply terminal and the second power-supply terminal are adapted to supplied therebetween with the first current or the second current, and
   in data reading, the first power-supply terminal and the second power-supply terminal are adapted to be set at a ground potential $V_{SS}$ and a power-supply potential $V_{DD}$, respectively.

16. The semiconductor memory element according to claim 9, wherein, the first two-terminal variable resistor element and the second two-terminal resistor element each are made of ionic conductive material, coming to a low-resistance phase by flowing a current in a first direction to decrease the resistance of the variable resistor element, and coming to a high-resistance phase by flowing a current in a second direction opposite to the first direction to increase the resistance of the variable resistor element.

17. The semiconductor memory element according to claim 9, which includes an interlayer insulating film having via holes and provided on the MIS transistor, and wherein the first and second resistor elements are buried in the via holes.

18. A semiconductor memory device including a word line, a common source line and a bit line, comprising:
   a memory cell unit which includes a power-supply node, a ground node, and a plurality of semiconductor memory elements each formed of the memory element of claim 4, MIS transistors of the memory elements being connected in series between the power-supply node and the ground node, and each of the memory elements having first and second power-supply terminals connected to the word line and the common source line, respectively;
   a first selection transistor which is connected between the ground node of the memory cell unit and the common source line; and
   a second selection transistor connected between the power-supply node of the memory cell unit and the bit line.

19. A semiconductor memory device including a word line, a common control line, a source line and a bit line, comprising:
   a memory cell unit which includes a power-supply node, a ground node, and a plurality of semiconductor memory elements each formed of the memory element of claim 9, MIS transistors of the memory elements being connected in series between the power-supply node and the ground node, and each of the memory elements having a first power-supply terminal connected to the word line and a second power-supply terminal connected to the control line;
   a first selection transistor which is connected between the ground node of the memory cell unit and the source line; and
   a second selection transistor connected between the power-supply node of the memory cell unit and the bit line.

20. The semiconductor memory device according to claim 19, wherein the common control line is released in data reading, and the common control line, the word line and the source line are supplied with a current to data writing or data erasing.

* * * * *